(12) United States Patent
Li

(10) Patent No.: US 6,659,778 B2
(45) Date of Patent: Dec. 9, 2003

(54) CONTACT ASSEMBLY FOR LAND GRID ARRAY INTERPOSER OR ELECTRICAL CONNECTOR

(75) Inventor: Che-Yu Li, Roslyn, NY (US)

(73) Assignee: High Connection Density, Inc, Sunnyvale, CA (US)

(*) Notice: Subject to any disclaimer, the term of this patent is extended or adjusted under 35 U.S.C. 154(b) by 0 days.

(21) Appl. No.: 10/210,300

(22) Filed: Aug. 1, 2002

(65) Prior Publication Data

US 2002/0187663 A1 Dec. 12, 2002

Related U.S. Application Data

(63) Continuation of application No. 09/774,336, filed on Jan. 31, 2001, now Pat. No. 6,439,894.

(51) Int. Cl.[7] .............................................. H01R 12/00
(52) U.S. Cl. ......................................... 439/66; 439/840
(58) Field of Search .......................... 439/66, 840, 525, 439/91, 591, 295, 841, 817

(56) References Cited

U.S. PATENT DOCUMENTS

| | | | |
|---|---|---|---|
| 2,153,177 A | 4/1939 | Ecker |
| 3,317,885 A | 5/1967 | Yost |
| 3,364,303 A | 1/1968 | Slick |
| 3,513,434 A | 5/1970 | Zielke |
| 3,795,884 A | 3/1974 | Kotaka |
| 3,885,848 A | 5/1975 | Brouneus |
| 4,000,745 A | 1/1977 | Goldberg |
| 4,029,375 A | 6/1977 | Gabrielian |
| 4,541,681 A | 9/1985 | Dorman et al. |
| 4,810,213 A | 3/1989 | Chabot |
| 4,820,376 A | 4/1989 | Lambert et al. |
| 4,838,815 A | 6/1989 | Tajima et al. |
| 4,922,376 A | 5/1990 | Pommer et al. |
| 5,030,109 A | 7/1991 | Dery |
| 5,061,191 A | 10/1991 | Casciotti et al. |
| 5,232,372 A | 8/1993 | Bradley et al. |
| 5,273,438 A | 12/1993 | Bradley et al. |
| 5,385,477 A | 1/1995 | Vaynkof et al. |
| 5,403,194 A | 4/1995 | Yamazaki |
| 5,427,535 A | 6/1995 | Sinclair |
| 5,473,510 A | 12/1995 | Dozier, II |
| 5,632,626 A | 5/1997 | Collins et al. |
| 5,746,616 A | 5/1998 | Mar |
| 6,033,233 A | 3/2000 | Haseyama et al. |
| 6,074,219 A | 6/2000 | Tustaniwskyj et al. |
| 6,086,432 A | 7/2000 | Frinker et al. |
| 6,174,174 B1 | 1/2001 | Suzuki et al. |
| 6,287,126 B1 | 9/2001 | Berger et al. |
| 6,313,523 B1 * | 11/2001 | Morris et al. ............... 257/696 |
| 6,341,962 B1 * | 1/2002 | Sinclair ....................... 439/66 |
| 6,386,890 B1 * | 5/2002 | Bhatt et al. .................. 439/67 |
| 6,388,885 B1 * | 5/2002 | Alexander et al. .......... 361/760 |
| 6,439,894 B1 | 8/2002 | Li |

* cited by examiner

Primary Examiner—Tho D. Ta
Assistant Examiner—Edwin A. León
(74) Attorney, Agent, or Firm—Duane Morris LLP

(57) ABSTRACT

The present invention provides an electrical contact comprising a first member having spring properties and a second member wrapped around at least a portion of the first member wherein the second member has a greater electrical conductivity than the first member. In one embodiment, a conductor is wrapped around at least a portion of a spring. In another embodiment, the spring is formed into a coil or helix with a wire wrapped around at least a portion of the helical spring. In one form of this embodiment, the spring has a plurality of turns and the wire is wrapped around at least two of the turns. In another form of this embodiment, the spring has a plurality of turns and the wire is wrapped around all of the turns. An interposer connector is also provided having a frame including a top surface and a bottom surface and a plurality of apertures arranged in a pattern and opening onto the top and bottom surfaces of the frame. A plurality of springs are provided with each spring having a conductor wrapped around at least a portion of the spring where the conductor has a greater electrical conductivity than the spring. One of the springs is positioned within each of the apertures so that at least a portion of each of the conductors is exposed above the top and bottom surfaces of the frame.

9 Claims, 9 Drawing Sheets

CONTACT ASSEMBLY FOR LAND GRID ARRAY INTERPOSER OR ELECTRICAL CONNECTOR

This application is a continuation application of U.S. application Ser. No. 09/774,336, filed on Jan. 31, 2001 now U.S. Pat. No. 6,439,894.

FIELD OF THE INVENTION

The present invention generally relates to the electrical interconnection devices in general, and more particularly to contacts that are at the electrical interface between an integrated circuit package and a substrate or between an electrical connector and the same.

BACKGROUND OF THE INVENTION

High density integrated circuit (IC) packages that house LSI/VLSI type semiconductor devices are well known. Input/output pins for such IC packages are often arranged in such a dense pattern (sometimes more than two hundred closely spaced contacts) that direct soldering of the IC package to a substrate, such as a printed wiring or circuit board (PCB) creates several significant problems related to inspection and correction of any resulting soldering faults.

Land grid array (LGA) connectors are known for interconnecting IC packages to PCB's. LGA's typically do not require soldering procedures during engagement with the PCB. Referring to FIG. 1, prior art LGA assemblies are used to interconnect an IC package 7 having a plurality of flat contact pads 12 formed on a bottom surface, to contact pads 16 arranged in a regular pattern on a surface of PCB 19. Current technology permits conductive pads 12 and conductive pads 16 to be disposed at center-to-center spacings (as indicated by dimension "a" in FIG. 1) of approximately one half to one millimeter, with further miniaturization possible and inevitable.

Prior art LGA assemblies are known which include an insulative housing and a plurality of resilient conductive contacts received in passageways formed in the housing. The resilient conductive contacts typically have exposed portions at the upper and lower surfaces of the insulative housing for engaging flat contact pads 12,16. When IC package 7 is accurately positioned in overlying aligned engagement with PCB 19, such that conductive pads 12 engage conductive pads 16, a normal force is applied to the exposed portions of each resilient conductive contact to electrically and mechanically engage the respective contact pads.

The resilient conductive contacts associated with prior art LGA's have had a variety of shapes. A commonly used form of resilient conductive contact includes two free ends connected by a curved portion which provides for the storage of elastic energy during engagement with the IC package and PCB. Prior art resilient conductive contacts are usually a single metal structure in the form of a spring to provide the required elastic response during service while also serving as a conductive element for electrical connection. Typically, a combination of barrier metal and noble metal platings is applied to the surface of the spring for corrosion prevention and for electrical contact enhancement. It is often the case that these platings are not of sufficient thickness for electrical conduction along the surface of the spring. Examples of such prior art resilient conductive contacts may be found in U.S. Pat. Nos. 2,153,177; 3,317,885; 3,513,434; 3,795,884; 4,029,375; 4,810,213; 4,820,376; 4,838,815; 4,922,376; 5,030,109; 5,061,191; 5,232,372; and 5,473,510. The foregoing patents are hereby incorporated herein by reference.

One such problem in the art exists in that a good material for the construction of a spring, such as a high strength steel, is not a very good electrical conductor. On the other hand, a good electrical conductor, such as a copper alloy or precious metal, is often not a good spring material. There is a need for a more simplified resilient conductive contact which incorporates the seemingly opposing requirements of good spring properties and high conductivity. Therefore, an improved electrical contact for use in an LGA socket or electrical connector is needed which can overcome the drawbacks of conventional electrical contacts.

SUMMARY OF THE INVENTION

The present invention provides an electrical contact comprising a first member having spring properties and a second member wrapped around at least a portion of the first member wherein the second member has a greater electrical conductivity than the first member. In one embodiment, one or more conductors are wrapped around at least a portion of a spring to improve current carrying capability. In another embodiment, the spring is formed into a coil or helix with a wire wrapped around at least a portion of the helical spring. In one form of this embodiment, the spring has a plurality of turns and the wire is wrapped around at least two of the turns. In another form of this embodiment, the spring has a plurality of turns and the wire is wrapped around all of the turns. In a further alternative embodiment, multiple springs are enmeshed together to provide enhanced mechanical and electrical performance.

Thus the present invention provides, in general, an electrical contact having means for storing elastic energy and means for conducting electricity that are wrapped around at least a portion of the means for storing elastic energy. The means for conducting electricity advantageously has a greater electrical conductivity than the means for storing elastic energy.

In yet another embodiment of the invention, an interposer connector is provided having a frame including a top surface and a bottom surface and a plurality of apertures arranged in a pattern and opening onto the top and bottom surfaces of the frame. A plurality of springs are provided with each spring having a conductor wrapped around at least a portion of the spring where the conductor has a greater electrical conductivity than the spring. One of the springs is positioned within each of the apertures so that at least a portion of each of the conductors is exposed above the top and bottom surfaces of the frame. An electrical connector is also provided incorporating an electrical contact having spring means for storing elastic energy and means for conducting electricity that are wrapped around at least a portion of the spring means.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
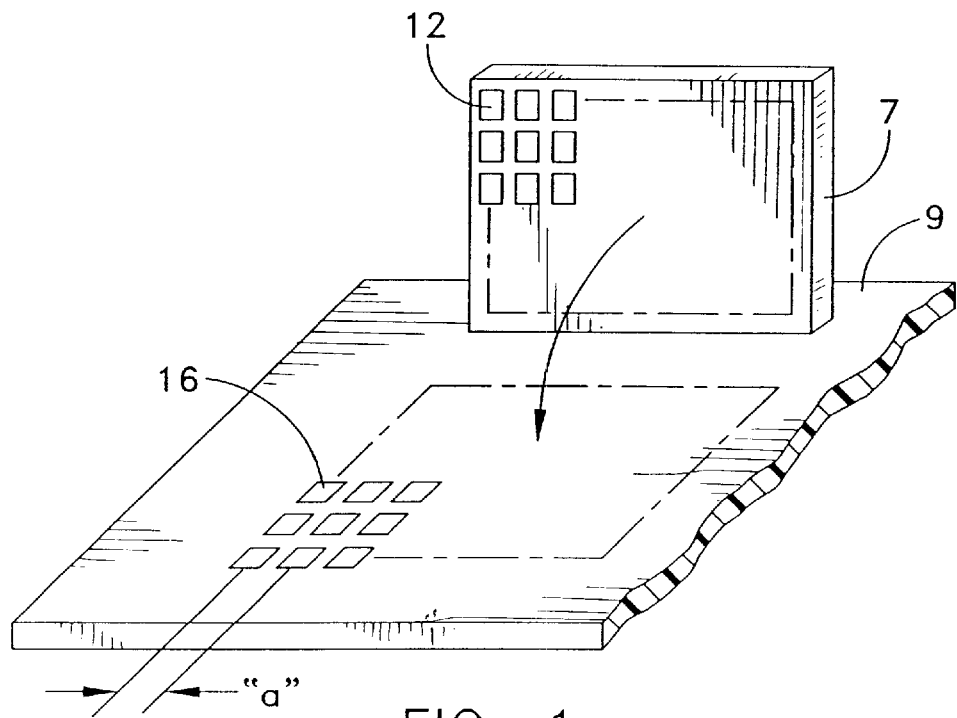
FIG. 1 is a perspective view of a prior art IC package and PCB.
Figure 2:
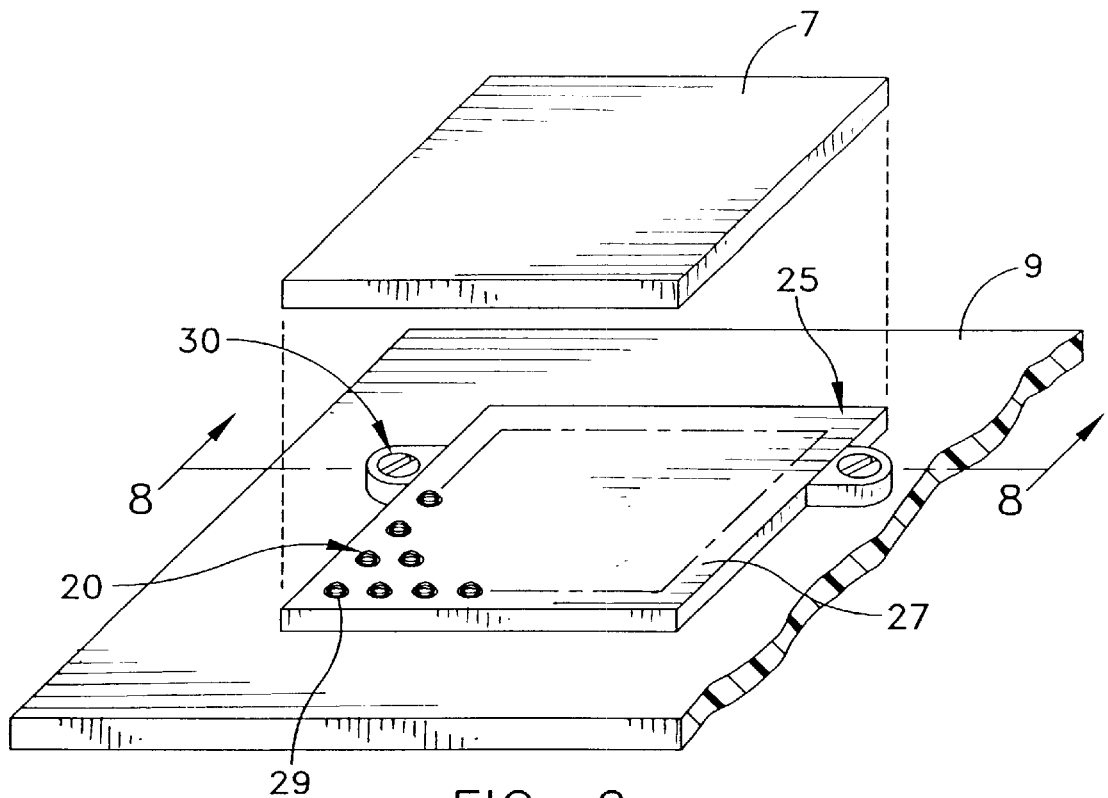
FIG. 2 is a perspective view of an IC package being mounted to a PCB with an interposer positioned between them that is formed in accordance with an embodiment of the invention.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

Referring to FIGS. 1–4, the present invention provides a pad engagement contact assembly 20 formed from at least two discrete materials, preferably two different metals. In one preferred embodiment, pad engagement contact assembly 20 is adapted for use in an LGA interposer 25 that is used to interconnect integrated circuit (IC) package 7 to PCB 19. LGA interposer 25 comprises a housing or frame 27 having a plurality of apertures 29 arranged in a grid or array that corresponds to plurality of conductive pads 12 and array of conductive pads 16. The portions of frame 27 that define apertures 29 are each sized and shaped so as to accept and support a pad engagement assembly 20. Means for securely mounting LGA interposer 25 to PCB 19 are also provided, and indicated generally at reference numeral 30.

Figure 3:
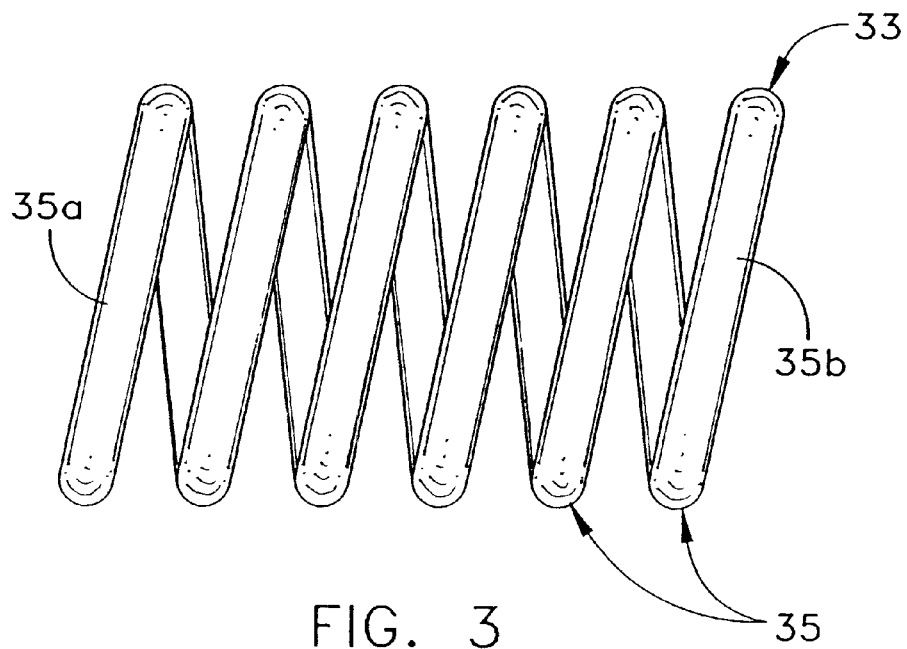
FIG. 3 is a side elevational view of a first member formed in accordance with an embodiment of the present invention.
Figure 4:
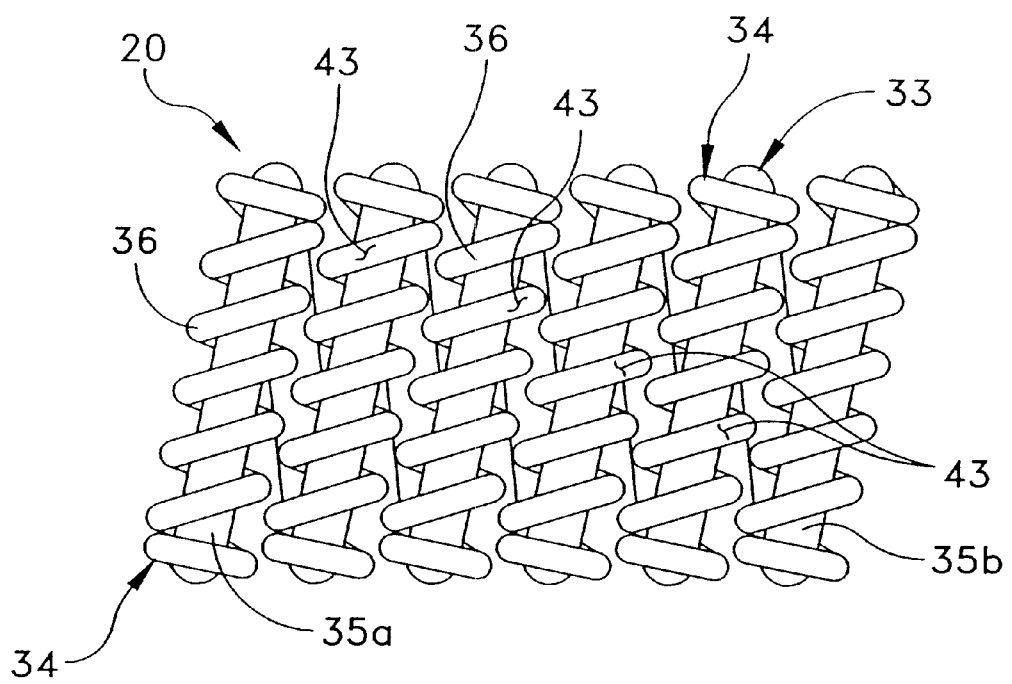
FIG. 4 is a side elevational view of a first member having a second member wrapped around it to form a pad engagement contact assembly in accordance with an embodiment of the present invention.

Referring to FIGS. 3 and 4, pad engagement contact assembly 20 comprises a first member 33 and a second member 34. First member 33 comprises a material and structure that are particularly well adapted for use as an elastic energy storage device. For example, first member 33 may be formed from one of the group of metals known for superior mechanical properties, including high elastic modulus, high yield strength, formability, and resistance to relaxation at high temperatures, such as, steel, brass phosphor bronze, beryllium copper, or the various alloys of the foregoing metals that incorporate other elements and compounds to enhance their spring properties. Second member 34 comprises a material and structure that are particularly well adapted for conduction of electricity. For example, second member 34 may be formed from one of the group of metals known for superior electrical conduction, thermal conduction and formability, such as, gold, copper, palladium, platinum, or other highly conductive metals or other means for conducting electricity. Although not preferred, nonmetals exhibiting similar electrical and structural properties, e.g., composites, polymers, or the like, may be used to form pad engagement contact assembly 20, and are within the scope of the invention.

In a preferred embodiment, first member 33 may be formed from a wire, strip, tube, tape or other suitably formable raw stock into a coil or helical spring comprising a plurality of first member turns 35, and including a top turn 35a and a bottom turn 35b (FIG. 3). Second member 34 may be formed from a wire, strip, tube, tape or other formable raw stock that is suitable for winding around first member 33 so as to form a plurality of second member turns 36. Second member 34 may be wound around first member 33, prior to forming of first member 33 into a coil, or after, as long as plurality of second member turns 36 are positioned upon first member turns 35.

Of course, first member 33 (with second member 34 wound around it) may be formed into various structures or means for storing elastic energy that exhibit spring properties when compressed, expanded, or bent. The structure selected for first member 33 must possess an elastic constant that produces a spring rate sufficient to provide acceptable levels of contact force, as well as, suitable compliance and resilience during service. When combined with first member 33, second member 34 presents a plurality of curved, outwardly directed contact surfaces 43. During service, the compression of second member 34 produces a wiping action along the interface between pads 12,16 and contact surfaces 43 which is a requirement for good electrical contact. It should also be noted that multiple contact surfaces 43 are presented for contact with the surfaces of pads 12,16, thus providing redundant points of electrical and mechanical contact. Well known noble and semi-noble metal surface coatings may also be deposited upon one or both of members 33,34 to further enhance the electrical, mechanical and/or corrosion resistance capabilities of pad engagement contact assembly 20.

Figure 5:
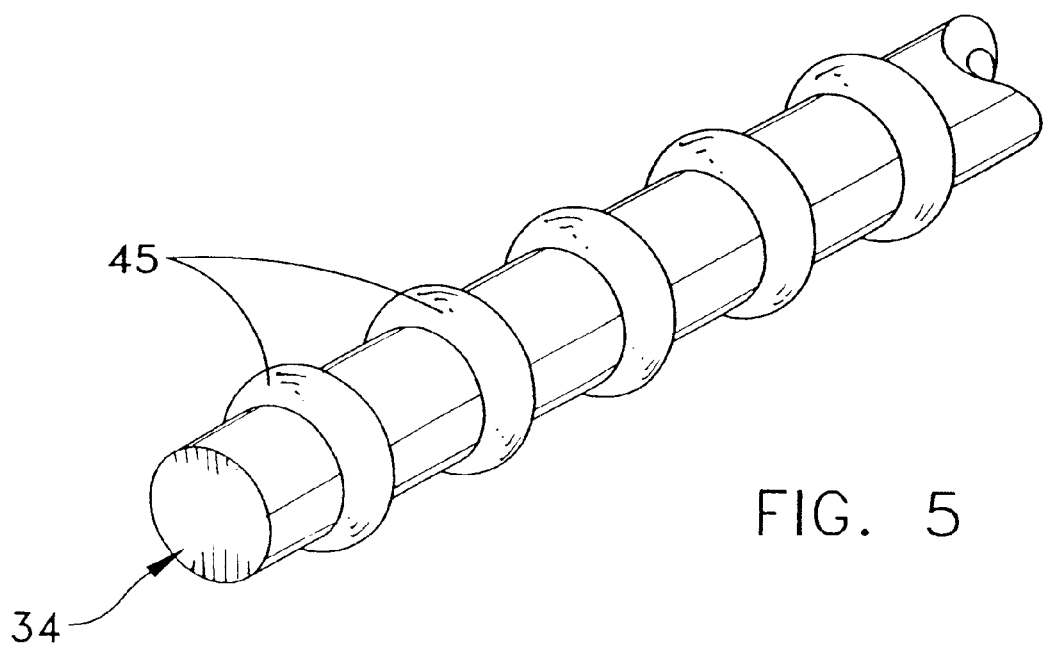
FIG. 5 is an enlarged perspective view of a broken-away portion of an alternative embodiment of the second member.
Figure 6:
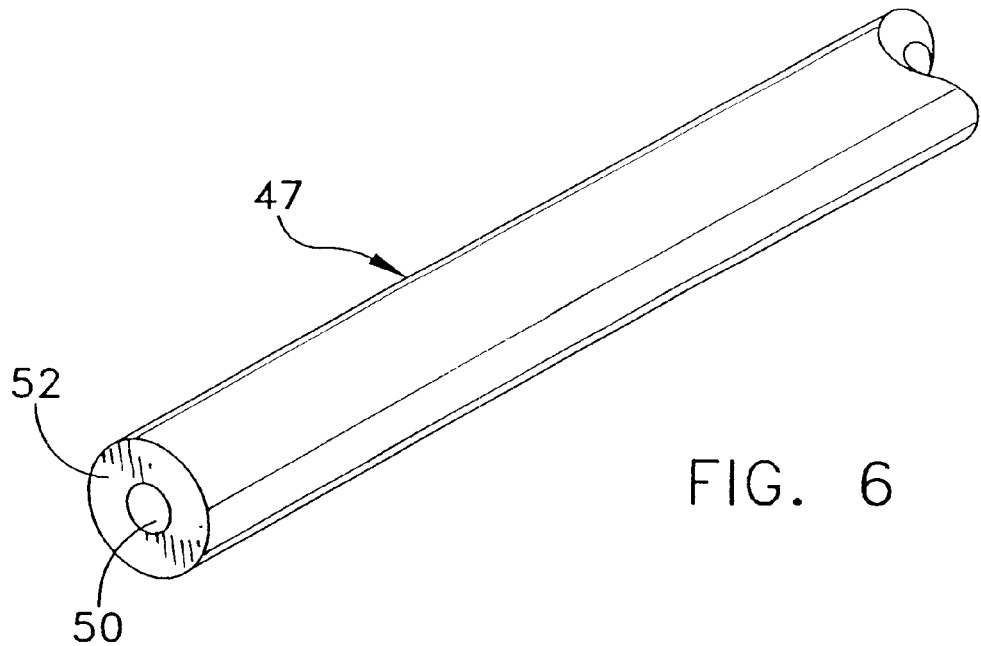
FIG. 6 is an enlarged perspective view of a broken-away portion of an alternative embodiment of the first member.
Figure 7:
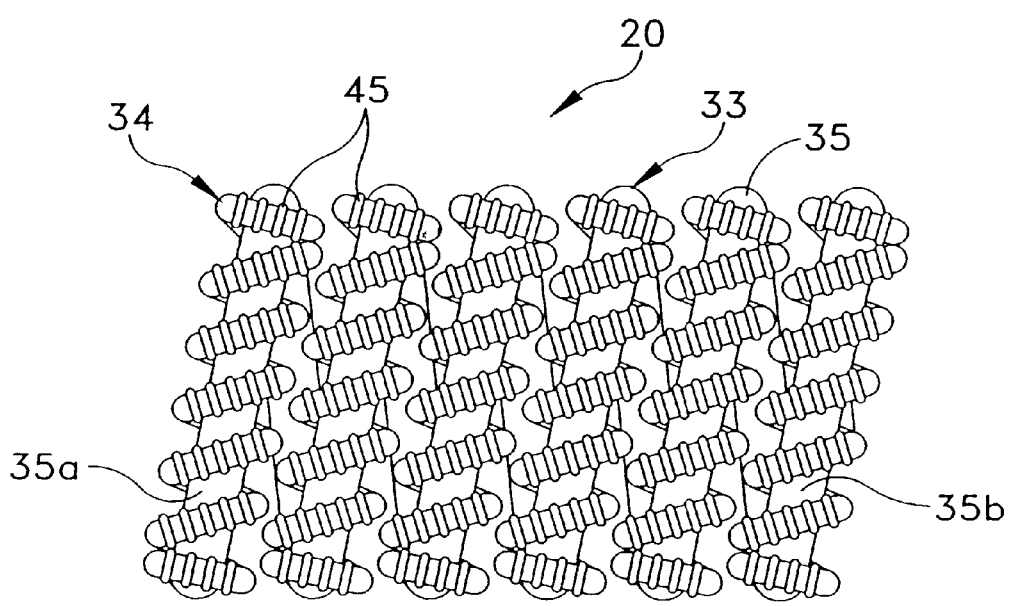
FIG. 7 is a side elevational view of a first member having an alternative embodiment of the second member wrapped around it to form a pad engagement contact assembly in accordance with another embodiment of the present invention.
Figure 12:
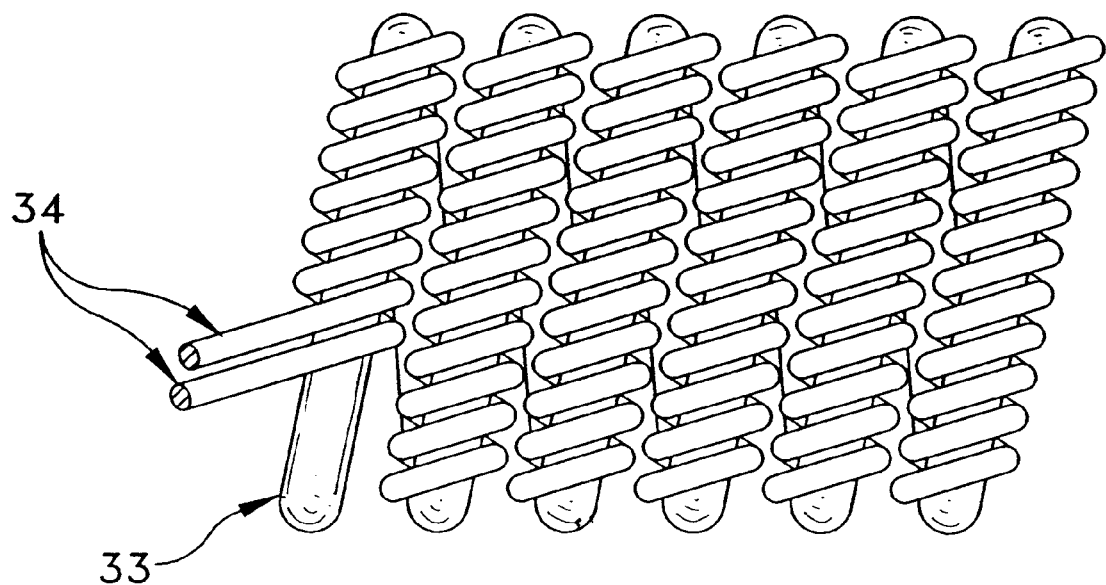
FIG. 12 is a side elevational view of an alternative embodiment of a pad engagement contact assembly having multiple conductors wrapped around at least one first member.
Figure 13:
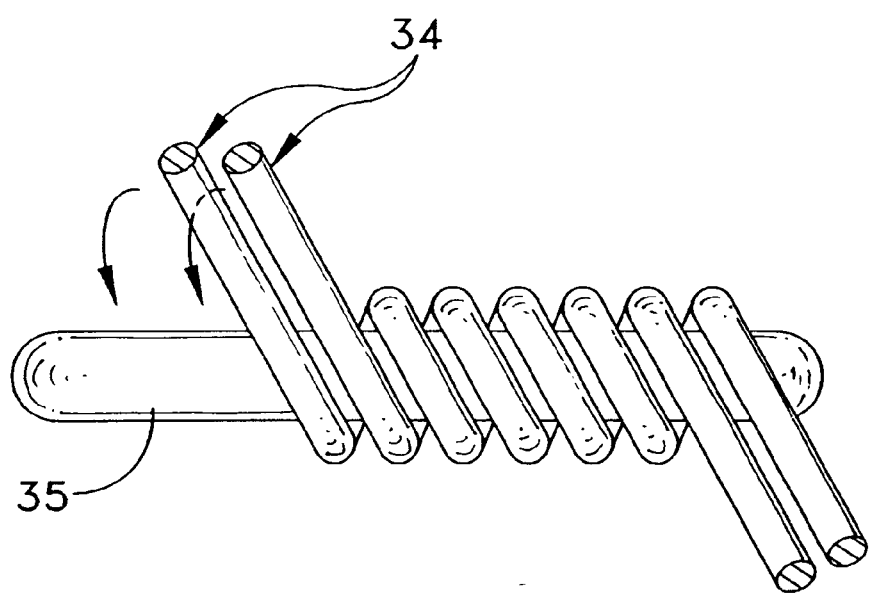
FIG. 13 is a side elevational view of a portion of the alternative embodiment shown in FIG. 12 showing two conductors wrapped around a turn.
Figure 14:
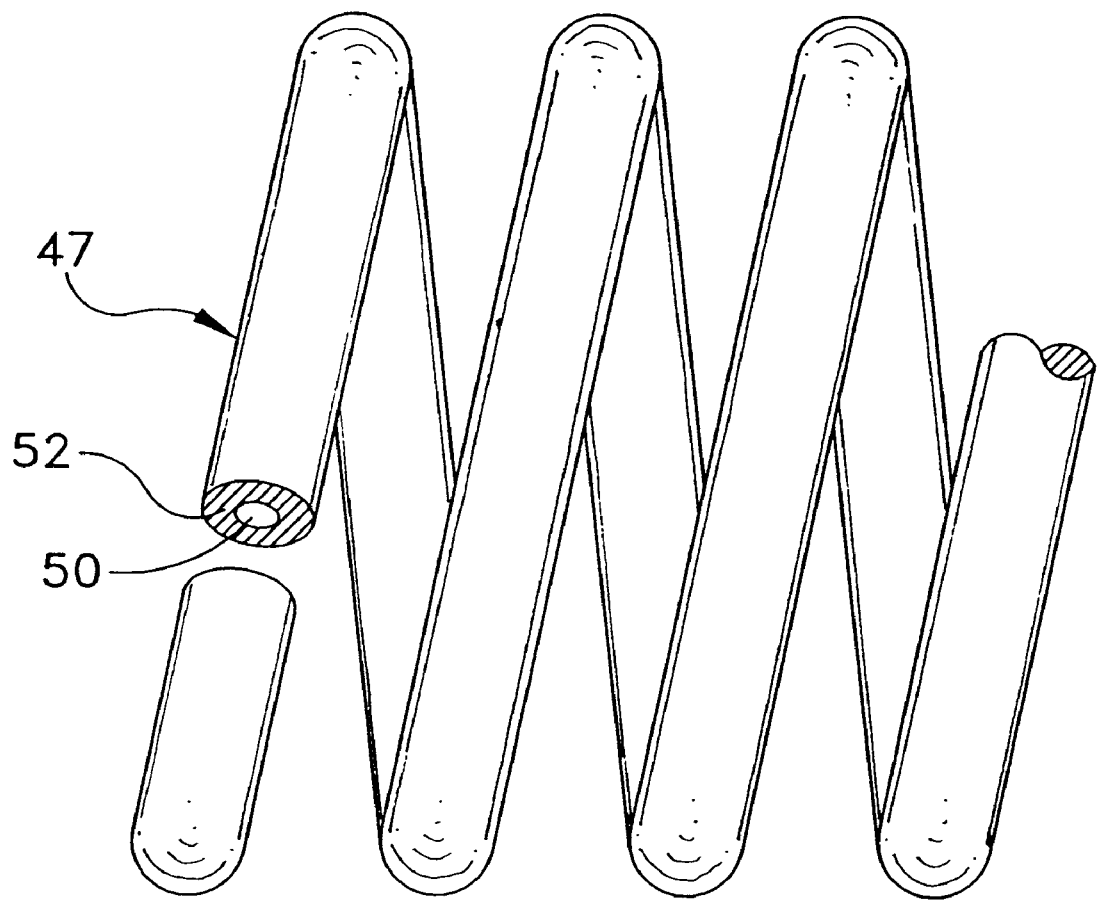
FIG. 14 is a side elevational view of an alternative embodiment of a pad engagement contact assembly formed from the bimetallic material shown in FIG. 6.
Figure 15:
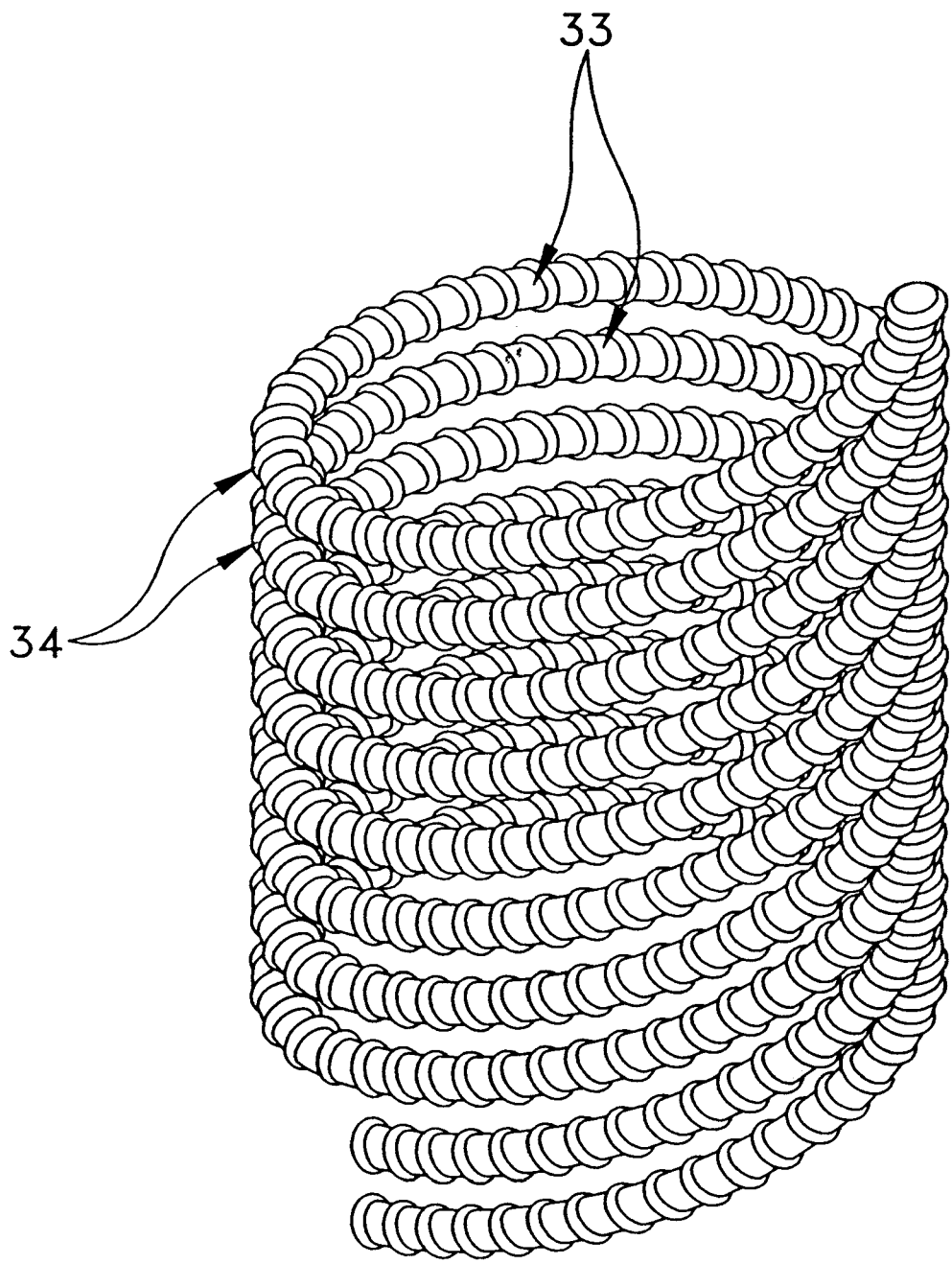
FIG. 15 is a perspective view of an alternative embodiment of the invention having two coil springs that are enmeshed together and wrapped with a conductor.

In one alternative embodiment, the surface of second member 34 may comprise dimples, ribs or corrugations 45 (FIGS. 5 and 7). During service, the compression of second member 34 produces a wiping action along the interface between pads 12,16 and dimples, ribs or corrugations 45 which enhances the electrical transmission properties of the interface. In another embodiment of the invention, pad engagement contact assembly 20 may be formed as an integral strip, such as a bimetallic strip or wire 47 comprising an inner spring metal portion 50 and an outer conductive metal portion 52 (FIGS. 6 and 14) so that first member 33 spring may be formed without the need for a secondary step to add second member 34. Second member 34 may also be disposed on first member 33 in the form of a conductive strip for electrical contact and conduction, or there may be two or more second members 34 (FIGS. 12 and 13). In yet another embodiment of the invention, pad engagement contact assembly 20 may be formed as two helical springs that are enmeshed together (FIG. 15).

Figure 8:
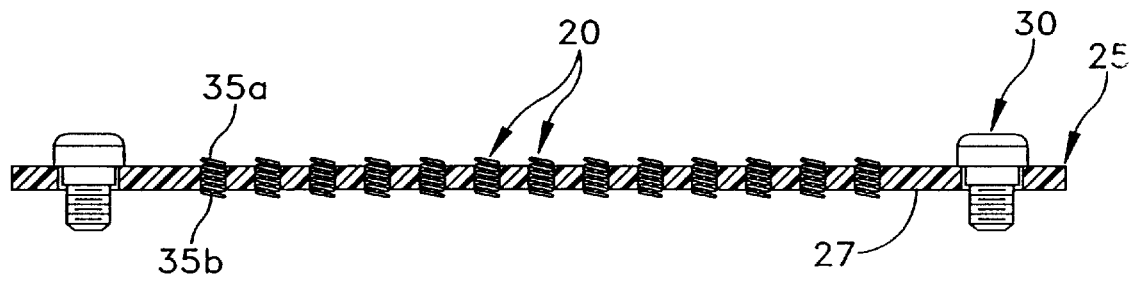
FIG. 8 is a cross-sectional view of an interposer having a plurality of pad engagement contact assemblies that are formed from at least two discrete metal members.
Figure 9:
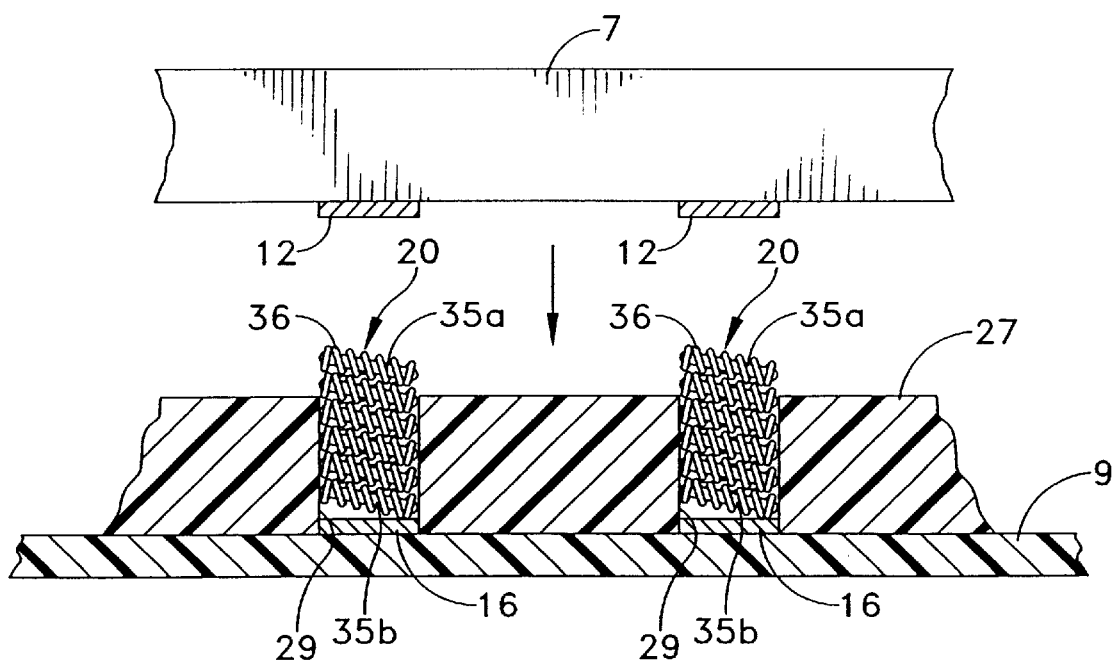
FIG. 9 is a cross-sectional view of a broken-way portion of the interposer shown in FIG. 8, with a portion of the IC package positioned above the interposer.

Referring to FIGS. 8 and 9, a pad engagement contact assembly 20 is arranged vertically within each aperture 29 in frame 27 of LGA interposer 25. In this construction, top turn 35a is exposed above the top surface of frame 27 and bottom turn 35b is exposed above the bottom surface of frame 27 so that a plurality of second member turns 36 are in position to engage array of conductive pads 12 and array of conductive pads 16. In this way, each pad engagement contact assembly 20 provides a multitude of electrical engagement surfaces for each of conductive pads 12 and conductive pads 16 thus providing redundant electrical interconnection. The intermediate first member turns 35 provide for the storage of elastic energy during engagement with IC package 7 and PCB 9.

Figure 10:
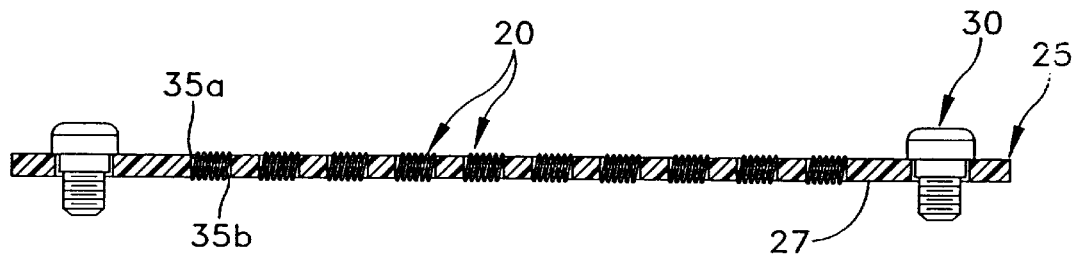
FIG. 10 is a cross-sectional view of an interposer having a plurality of pad engagement contact assemblies that are formed from at least two discrete metal members according to an alternative embodiment.
Figure 11:
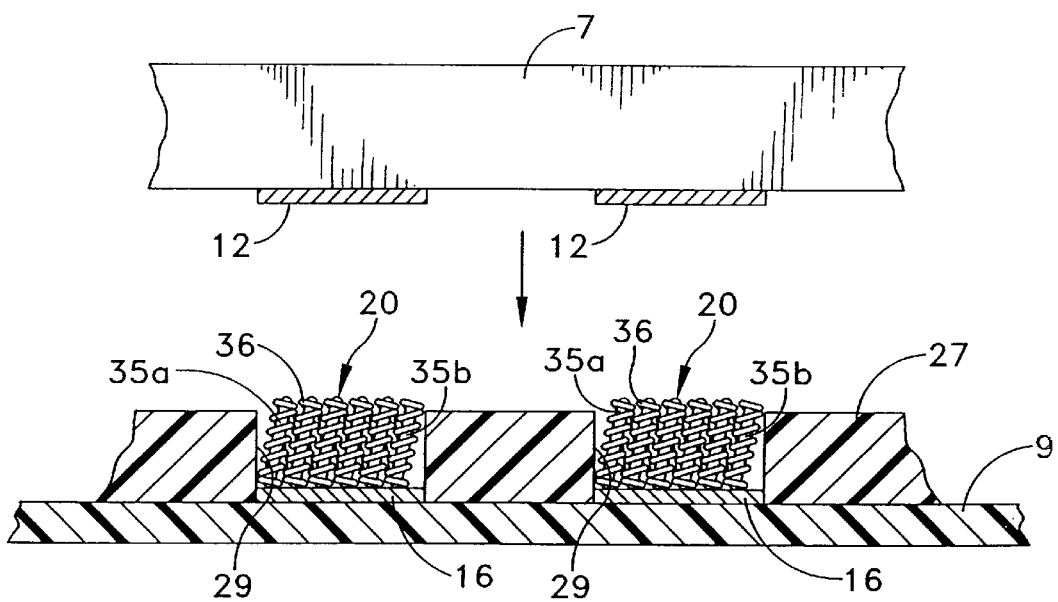
FIG. 11 is a cross-sectional view of a broken-way portion of the interposer shown in FIG. 10, with a portion of the IC package positioned above the interposer.

In an alternative embodiment, pad engagement contact assemblies 20 are oriented horizontally relative to frame 27 so that top turn 35a and bottom turn 35b mechanically engage the surfaces of frame 27 that define the interior of apertures 29 (FIGS. 10 and 11). In this embodiment the portions of second member turns 36 that are positioned on the first member turns intermediate of top turn 35a and bottom turn 35b are exposed above the top and bottom surfaces of frame 27 so that a plurality of second member turns 36 are in position to engage array of conductive pads 12 and array of conductive pads 16. Here again, the intermediate first member turns 35 provide for the storage of elastic energy during engagement with IC package 7 and PCB 9.

It is to be understood that the present invention is by no means limited only to the particular constructions herein disclosed and shown in the drawings, but also comprises any modifications or equivalents within the scope of the claims.

What is claimed is:

1. An electrical contact comprising a first spring member having a plurality of turns and a second member comprising a wire that is wrapped around at least two of said first spring member turns wherein said second member has a greater electrical conductivity than said first spring member.

2. An electrical contact according to claim 1 wherein said first member comprises a spring having a plurality of turns and said wire is wrapped around at least two of said turns so as to form a plurality of second turns.

3. An electrical contact according to claim 1 wherein said spring comprises a coil including a plurality of turns, defining a top turn and a bottom turn and said wire is wound around at least said top turn and said bottom turn of said spring.

4. An electrical contact according to claim 1 wherein said spring comprises a helical spring and said wire is wrapped around at least a portion of said helical spring wherein said wire has a greater electrical conductivity than said helical spring.

5. An electrical contact according to claim 1 wherein said second member comprises an outer surface that is at least one of dimpled, ribbed or corrugated.

6. An electrical contact according to claim 1 wherein said spring is formed from a bimetallic material having an inner metal core and an outer metal jacket wherein said outer metal jacket comprises a greater electrical conductivity than said inner metal core.

7. An electrical contact according to claim 1 wherein said spring has a plurality of turns and said wire is wrapped around substantially all of said turns so as to form a plurality of conductor turns.

8. An electrical contact according to claim 7 wherein said plurality of conductor turns provide a plurality of curved outwardly directed contact surfaces.

9. An electrical contact according to claim 8 wherein said curved outwardly directed contact surfaces produce a wiping action on a contact pad.

* * * * *